US012525421B2

(12) United States Patent
Tseng et al.

(10) Patent No.: US 12,525,421 B2
(45) Date of Patent: Jan. 13, 2026

(54) ION SOURCE HEAD AND ION SOURCE HEAD CURVED LINER, DEFLECTOR, OR REPELLER

(71) Applicant: Taiwan Semiconductor Manufacturing Co., Ltd., Hsinchu (TW)

(72) Inventors: Po-Tang Tseng, Hsinchu (TW); Ching-Heng Yen, Hsinchu (TW); Tai-Kun Kao, Hsinchu (TW); Sheng-Tai Peng, Hsinchu (TW); Chun Yan Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 385 days.

(21) Appl. No.: 18/158,357

(22) Filed: Jan. 23, 2023

(65) Prior Publication Data

US 2024/0249906 A1 Jul. 25, 2024

(51) Int. Cl.

| | |
|---|---|
| ***H01J 37/08*** | (2006.01) |
| ***H01J 37/31*** | (2006.01) |
| ***H01J 37/317*** | (2006.01) |

(52) U.S. Cl.

CPC .......... *H01J 37/08* (2013.01); *H01J 37/3171* (2013.01); *H01J 2237/0815* (2013.01)

(58) Field of Classification Search

CPC . H01J 37/08; H01J 37/3171; H01J 2237/0815

See application file for complete search history.

(56) References Cited

U.S. PATENT DOCUMENTS

2021/0020402 A1 * 1/2021 Tang .................. H01J 37/3171

* cited by examiner

*Primary Examiner* — Nicole M Ippolito

(74) *Attorney, Agent, or Firm* — Seed IP Law Group

(57) ABSTRACT

An ion source head includes a curved liner that is configured to more closely and accurately repel, direct, or deflect ion species generated within an ion source cavity of an ion source container of an ion source head towards an ion beam opening that extends through the ion source container of the ion source head. This prevents or reduces the ion species from becoming trapped in the ion source cavity instead of exiting the ion source cavity through the ion beam opening that extends through the ion source container of the ion source head. The curved liner may be received by a curved structure of the ion source container of the ion source head. The ion source head may be utilized within an implanter tool to refine or process a solid target with the ion beam generated by the ion source head with the curved liner.

20 Claims, 12 Drawing Sheets

ION SOURCE HEAD AND ION SOURCE HEAD CURVED LINER, DEFLECTOR, OR REPELLER

BACKGROUND

Ion implantation is a semiconductor wafer fabrication process by which ions of an element are accelerated and implanted into target regions on a wafer, thereby adjusting chemical, physical, or electrical properties of the target regions on the wafer. Besides semiconductor device fabrication, ion implantation is also used in metal surface finishing and material preparations to improve the mechanical, chemical and/or electrical properties of the targets receiving the implanted ions. For example, the ions implanted into a target can alter the elemental composition of the target, and can also cause changes in chemical and physical property via the energy impinged into the target together with the ions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
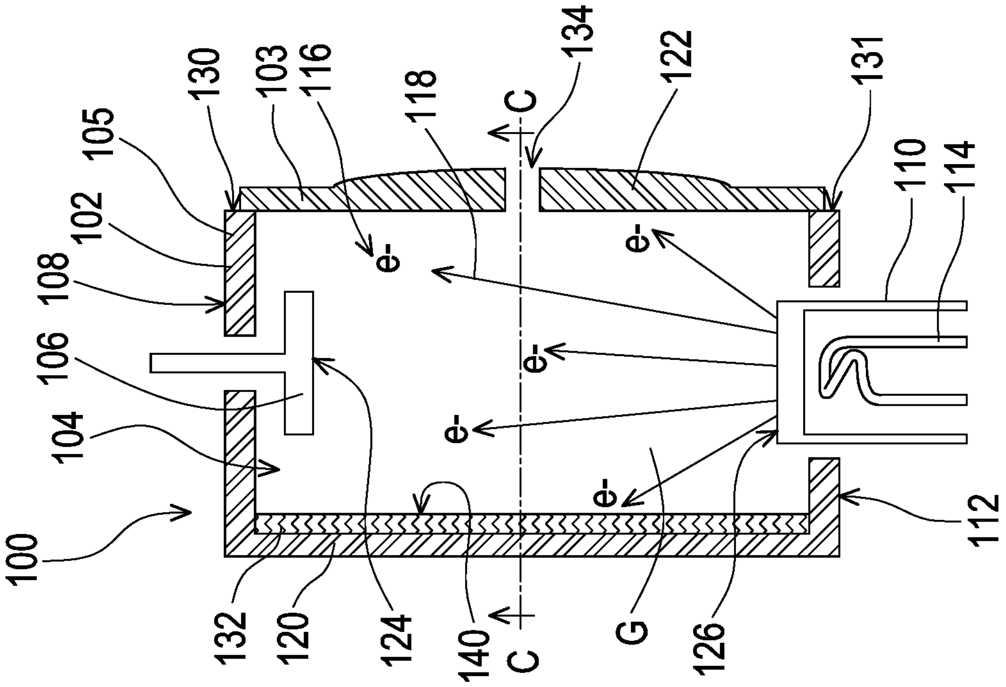
FIG. 1A is a top side view of an ion source head.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, semiconductor devices (e.g., semiconductor dice, semiconductor integrated circuits, etc.) are manufactured by performing various processing steps on various conductive layers and semiconductor layers to form various conductive structures and pathways throughout the conductive layers and the semiconductor layers. For example, an ion implantation system may be utilized to accelerate ions of one species or element into a solid target such as a semiconductor target to change physical, chemical, or electrical properties of the solid target, which generally may be a semiconductor wafer, workpiece, or some other suitable type of solid target. This ion implantation is utilized in semiconductor device fabrication of various semiconductor devices (e.g., semiconductor dice, semiconductor integrated circuits, etc.). An ion source head may be utilized for generating ions of the species or element that are then filtered and pulled out of the ion source head, which are then accelerated through other components and structures of the ion implantation system to accelerate the ions of the species or element in the solid target (e.g., semiconductor wafer, semiconductor workpiece, etc.). However, at least some of the ions generated in the ion source head may become trapped in corners of the ion source head that results in the ion implantation process being less efficient as the trapped ions cannot exit the ion source head. The present disclosure is directed to providing a curved deflector within an ion source head to reduce or prevent the ions from becoming trapped in corners of the ion source head. Reducing or preventing the ions from becoming trapped in the corners of the ion source head improves efficiency of the ion implantation system and the ion implantation process such that the units per hour that may be manufactured by a semiconductor manufacturing plant (FAB) may be increased.

Figure 1B:
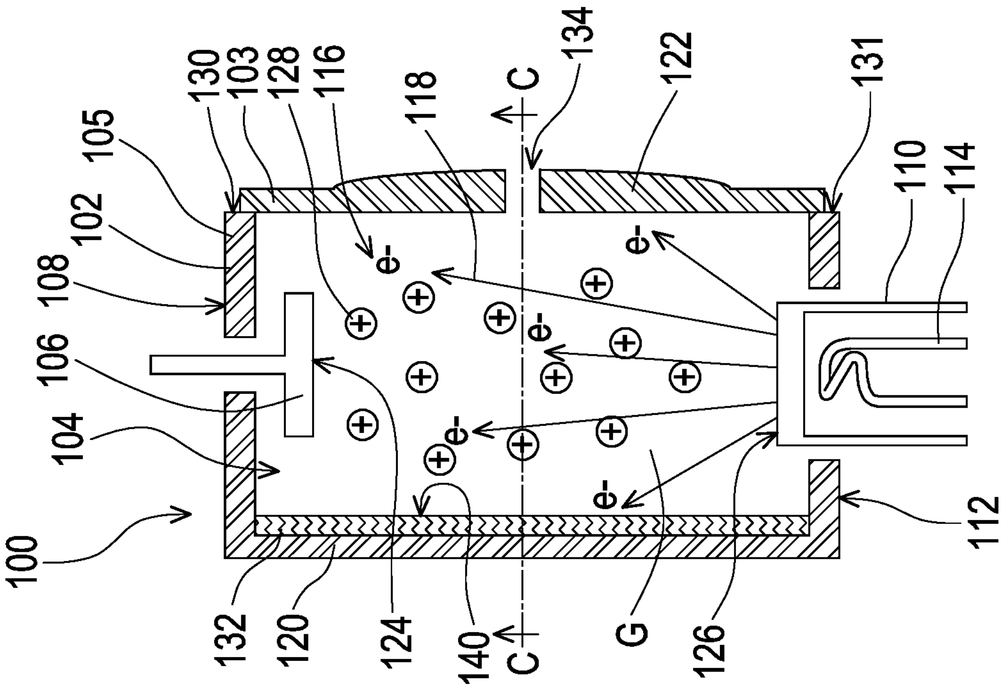
FIG. 1B is the top side view of the ion source head as shown in FIG. 1A.
Figure 1C:
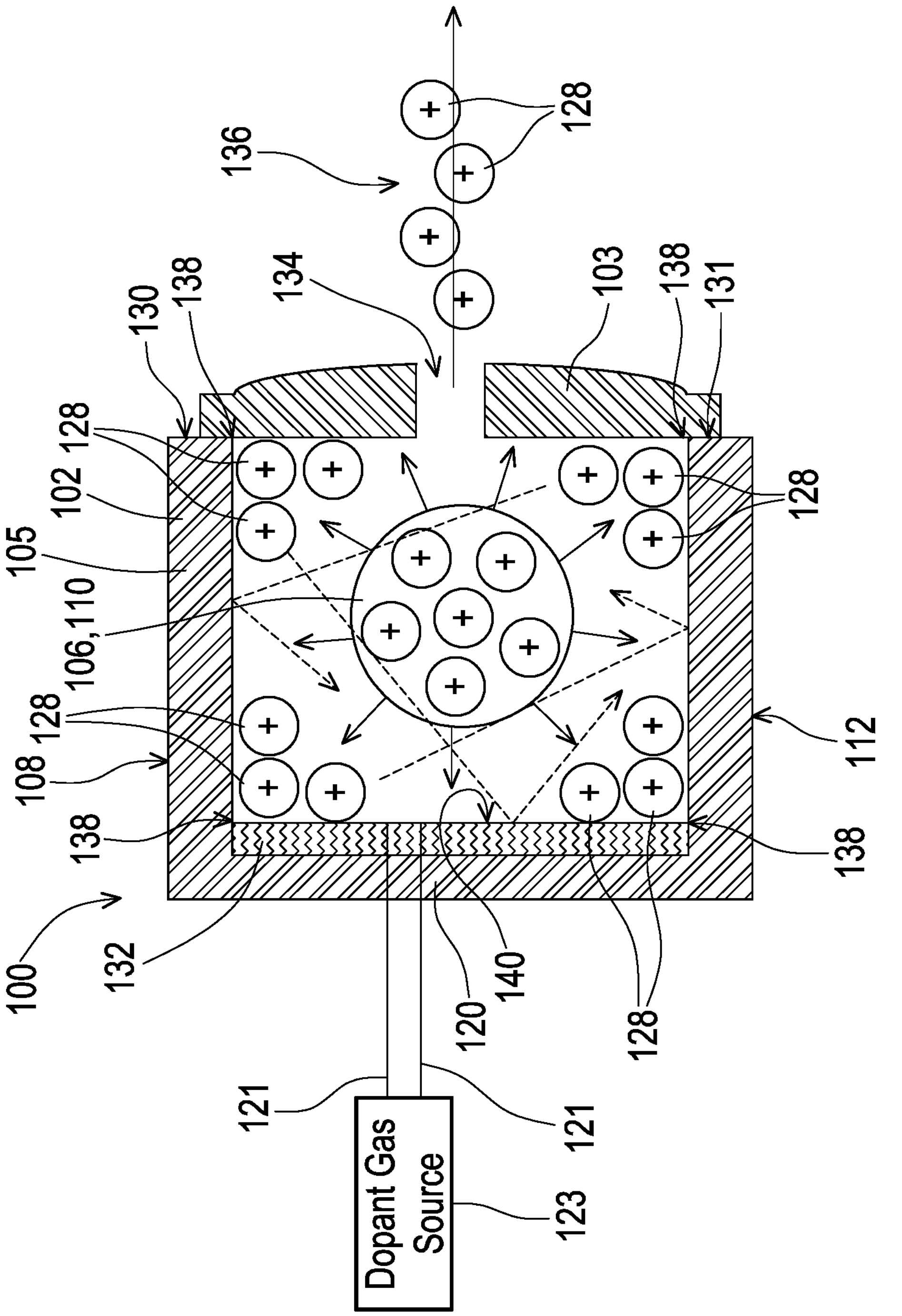
FIG. 1C is a cross-sectional side view of the ion source head taken along line C-C as shown in FIGS. 1A and 1B.

FIG. 1A is a top side view of an ion source head 100 including an ion source container 102 and an ion source cavity 104 that is within and delimited by the ion source container 102. FIG. 1B is a top side view of the ion source head 100 including the ion source container 102 and the ion source cavity 104. FIG. 1C is a cross-sectional side view of the ion source head 100 taken along line C-C as shown in FIGS. 1A and 1B, respectively. The ion source head 100 including the ion source cavity 104 and the ion source container 102. The ion source cavity 104 has a rectangular or square shape.

An anti-cathode 106, which in some embodiments may be an anode, is at a first end 108 of the ion source container 102 and a cathode 110 is at a second end 112 of the ion source container 102 opposite to the first end 108. The anti-cathode 106 extends through the first end 108 of the ion source container 102 such that the anti-cathode 106 is exposed to the ion cavity 104 within the ion source container 102. The cathode extends through the second end 112 of the ion source container 102 such that the cathode 110 is exposed to the ion cavity 104 within the ion source container 102. The anti-cathode 106 may be referred to as an anti-cathode electrode 106, and the cathode 110 may be referred to as a cathode electrode 110. In some embodiments, the positioning of the anti-cathode 106 and the cathode 110 may be switched based on the orientation of the anti-cathode 106 and the cathode 110 as shown in FIGS. 1A and 1B.

The cathode 110 includes a filament 114 that is housed within the cathode 110. In operation, a dopant gas or fluid G (e.g., Argon or some other suitable type of dopant gas) is present or introduced within the ion cavity 104 delimited by the ion source container 102 of the ion source head 100. Once the dopant gas G is present or introduced within the ion cavity 104, the filament 114 of the cathode 110 is activated resulting in electrons 116 being generated by the cathode 110. The filament 114 is activated by a power supply (not shown) in electrical communication with the filament 114 providing power to the filament 114. The power supplied by the power supply heats the filament 114 resulting in the filament 114 heating up, and the heating up of the filament 114 causes the cathode 110 to generate electrons 116 via electron bombardment to achieve thermionic emission of the electrons 116. In other words, the heating up of the filament 114 results in the generation of the electrons 116 by the cathode 110.

After the electrons 116 are generated by providing power to the filament 114 of the cathode 110, the electrons 116 travel towards the anti-cathode 106 and may travel away from the cathode 110, which is represented by arrows 118. For example, the electrons 116 may travel towards the anti-cathode 106 and away from the cathode 110 due to one or more electrical fields generated in close proximity to the first end 108 and the second end 112 of the ion source container 102, a first sidewall 120 of the ion source container 102, and a second sidewall 122 of the ion source container 102. The first sidewall 120 is opposite to the second sidewall 122, the first and second sidewalls 120, 122 are transverse to the first and second ends 108, 112, and the first and second sidewalls 120, 122 extend from the first end 108 to the second end 112, respectively. In some embodiments, a magnetic field may also be generated within the ion source cavity 104 to drive the electrons 116 to travel towards the anti-cathode 106 and away from the cathode 110, respectively, which again is represented by the arrows 118. In some embodiments, a plate 103, which defines the second sidewall 122, of the ion source container 102 is coupled to a portion 105 of the ion source container 102 that includes the first and second ends 108, 112 and the first sidewall 120. The first and second ends 108, 112 include respective side ends 130, 131 that are spaced apart and opposite to the first sidewall 120 of the ion source container 102, and the plate 103 is coupled to the respective side ends 130, 131. The plate 103 and the portion 105 are coupled together to define the ion source container 102 and to delimit the ion source cavity 104 within the ion source container 102. In some embodiments, the plate 103 and the portion 105 may be integral with each other such that the plate 103 and the portion 105 are made a single continuous material instead of being two separate and distinct components that are coupled together such as the plate 103 and the portion 105 of the ion source container 102.

The anti-cathode 106 includes an anti-cathode surface 124 that faces towards the second end 112 of the ion source container 102, and the anti-cathode surface 124 is transverse to the first and second sidewalls 120, 122, respectively, of the ion source container 102. The cathode 108 includes a cathode surface 126 that faces towards the first end 108 of the ion source container 102, faces towards the anti-cathode surface 124, and is transverse to the first and second sidewalls 120, 122, respectively, of the ion source container 102. As discussed earlier, electrical fields may be generated at the anti-cathode surface 124 and the cathode surface 126 by one or more power supplies (not shown) that are in electrical communication with the anti-cathode 106 and the cathode 108. The electrical potentials at the anti-cathode surface 124 and the cathode surface 126 may be switched back and forth to facilitate a movement or a direction of travel of the electrons 118 present within ion source cavity 104. For example, the electrons 116 generated by the cathode 110 may initially travel in the direction of the arrows 118 as shown in FIG. 1A, and, after a period of time, the electrical potentials at the anti-cathode surface 124 and the cathode surface 126 may be reversed such that the electrons 116 travel in an opposite direction opposite to the direction as represented by the arrows 118. This switching of the electrical potentials at the anti-cathode surface 124 and the cathode surface 126 may be repeated in successions several times to facilitate the electrons passing through the dopant gas G. As the electrons 116 pass through the dopant gas G present within the ion source cavity 104, ion species 128 (see FIG. 1B of the present disclosure) are generated due to collisions between the electrons 116 and the dopant gas G causing interactions between the electrons 116 and the dopant gas G generating the ion species 128. Such interactions may generate a plasma of multiple ion species including ion species desired to be implanted into a solid target (e.g., a semiconductor wafer, a semiconductor workpiece, or some other suitable type of solid target to be processed and refined by introducing the ion species 128 to the solid target). This generation of the ions may be readily seen in the top side view of the ion source head 100 as shown in FIG. 1B of the present disclosure.

After the ion species 128 are generated, the ion species 128 may exit the ion source container 102 through an ion beam opening 134 that extends through the plate 103 of the ion source container 102. The ion species 128 that exit through the ion beam opening 134 may then be introduced or exposed to the solid target thereby adjusting chemical, physical, or electrical properties at targeted regions along the solid target. While in the embodiment as shown in FIGS. 1A and 1B the ion beam opening 134 is relatively narrow such that the ion beam opening 134 extends a minority of the plate 103, in some alternative embodiments, the ion beam opening 134 may be wider such that the ion beam opening 134 is a slot that extends a majority of the plate 103.

A flat liner 132 is present at the first sidewall 120 of the ion source container 102. The flat liner 132 may be referred to as an ion species deflector or liner, which is configured to deflect or direct the ion species 128 through the ion beam opening 134 to generate an ion beam 136 (see FIG. 1C of the present disclosure). In some embodiments, the flat liner 132 may be coupled to a power supply (not shown) configured to provide power to the flat liner 132 such that the flat liner 132 has an electrical potential to direct the ion species 128 towards and through the ion beam opening 134 in the plate 103. However, as shown in FIG. 1C, as the ion beam 136 is generated by deflecting or directing the ion species 128 through the ion beam opening 134 in the plate 103, at least some of the ion species 128 become trapped within a plurality of corners 138 of the ion source cavity 104, which has the rectangular or square shape, delimited by the ion source container 102. The ion species 128 that become trapped in the corners 138 of the ion cavity 104 within the ion source container 102, which has the rectangular or square shape, do not exit the ion source container 102 through the ion beam opening 134 resulting in the efficiency of the ion source head 100 being reduced. This reduction in efficiency of the ion source head 100 in generating the ion beam 136 may also reduce a strength of the ion beam 136 that is generated utilizing the ion source head 100, which may result in a greater amount of power being used to refine or process the solid target that is to be exposed to the ion beam 136 generated by the ion source head 100.

Figure 2A:
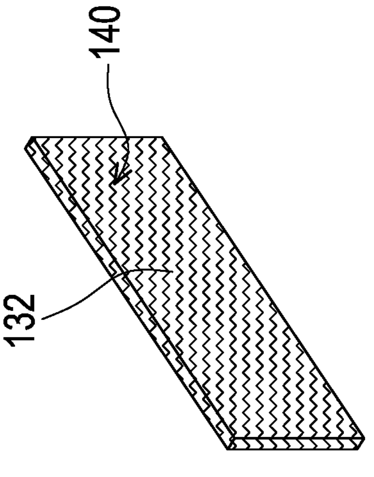
FIG. 2A is a perspective view of an ion source deflector.
Figure 2B:
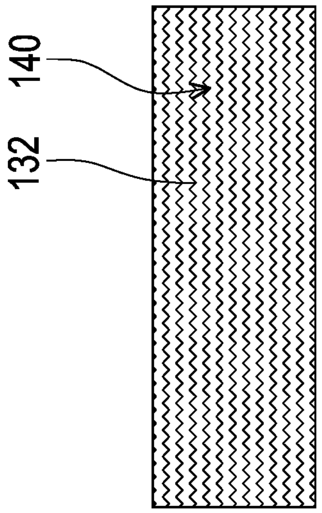
FIG. 2B is a front side view of the ion source deflector as shown in FIG. 2A.

FIG. 2A is a perspective view of the flat liner 132. FIG. 2B is a side view of the flat liner 132. As shown in FIGS. 2A and 2B, the flat liner 132 includes a flat liner surface 140. As shown in FIGS. 1A-1C, the flat liner surface 140 is exposed to the ion source cavity 104 within the ion source container 102 of the ion source head 100.

Figure 3A:
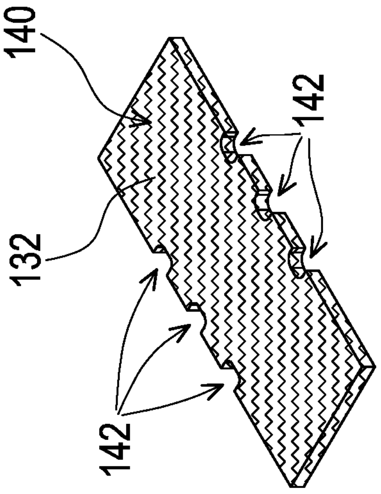
FIG. 3A is a perspective view of an alternative of the ion source deflector.
Figure 3B:
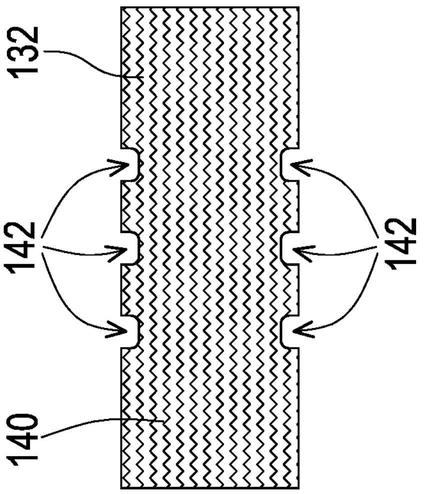
FIG. 3B is a side view of the alternative of the ion source deflector as shown in FIG. 3A.

FIG. 3A is a perspective view of an alternative of the flat liner 132. FIG. 3B is a side view of the alternative of the flat liner 132. As shown in FIGS. 3A and 3B, the alternative of the flat liner 132 includes the flat liner surface 140 and includes a plurality of dopant gas hose indentations, recesses, or cutouts 142 that extend into an upper and lower side of the alternative of the flat liner 132. The plurality of dopant gas hose indentations 142 are structured to receive a plurality of dopant gas hoses 121 (see FIG. 1C of the present disclosure) with outlets that are in fluid communication with the ion source cavity 104 within the ion source container 102 of the ion source head 100 such that the dopant gas G may be introduced by exiting through the outlets of the plurality of hoses. For example, each respective indentation of the plurality of dopant gas hose indentations 142 may receive a respective dopant gas hose of the plurality of dopant gas hoses 121 such that there is a one-to-one relationship between the plurality of dopant gas hose indentations 142 and the plurality of dopant gas hoses 121. Inlets of the plurality of dopant gas hoses 121 are opposite to the outlets of the plurality of dopant gas hoses 121, and the inlets of the plurality of dopant gas hoses 121 are in fluidic communication with a dopant gas source 123 (see FIG. 1C of the present disclosure) that provides the dopant gas G to the inlets of the plurality of dopant gas hoses 121 to be introduced through the outlets of the plurality of dopant gas hoses 121 into the ion source cavity 104 within the ion source container of the ion source head 100.

While not shown, one or more dopant gas hose through holes (not shown) may extend through the ion source container 102 such that the plurality of dopant gas hoses 121 may pass through the one or more dopant gas hose through holes to the plurality of dopant gas hose indentations 142 of the flat liner 132 such that the dopant gas G may be introduced into the ion source cavity 104. Alternatively, the one or more dopant hose through holes (not shown) may extend through the ion source container 102 to the ion source cavity 104 such that the plurality of dopant gas hoses 121 may introduce the dopant gas G into the ion source cavity 104.

Figure 4:
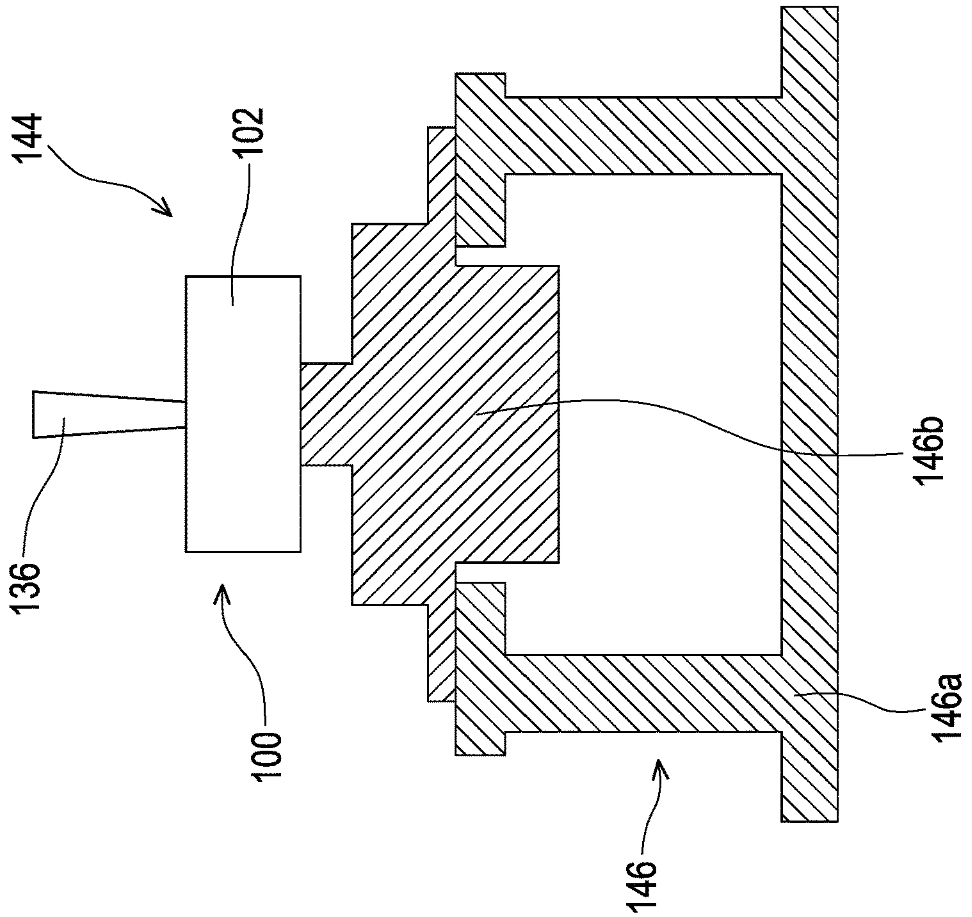
FIG. 4 is a top side view of an ion source assembly, in accordance with some embodiments.

FIG. 4 is directed to an ion source structure 144 including the ion source head 100 mounted on an ion source supporter 146. The ion source supporter 146 may include a mounting structure **146*a* and a coupling structure 146*b* to which the ion source head 100 is mounted. The ion source supporter 146 supports the ion source head 100. In some embodiments, the mounting structure 146*a* may be structured to be mounted to various surfaces such as by one or more fasteners. In some embodiments, the coupling structure 146*b* may include reception structures for receiving one or more electrical wires to provide power from one or more power supplies (not shown) to various respective components of the ion source head 100, and/or may include one or more reception structures for receiving the plurality of dopant gas hoses 121 to introduce the dopant gas G into the ion source cavity 104 within the ion source container of the ion source head 100**.

Figure 5A:
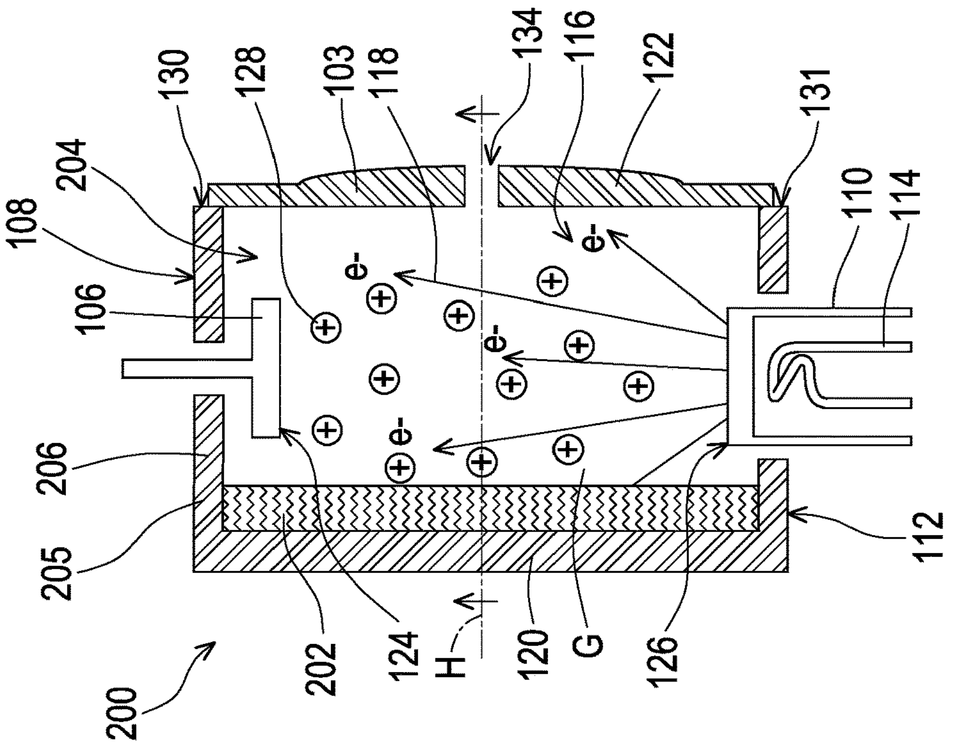
FIG. 5A is a top side view of an ion source head, in accordance with some embodiments.
Figure 5B:
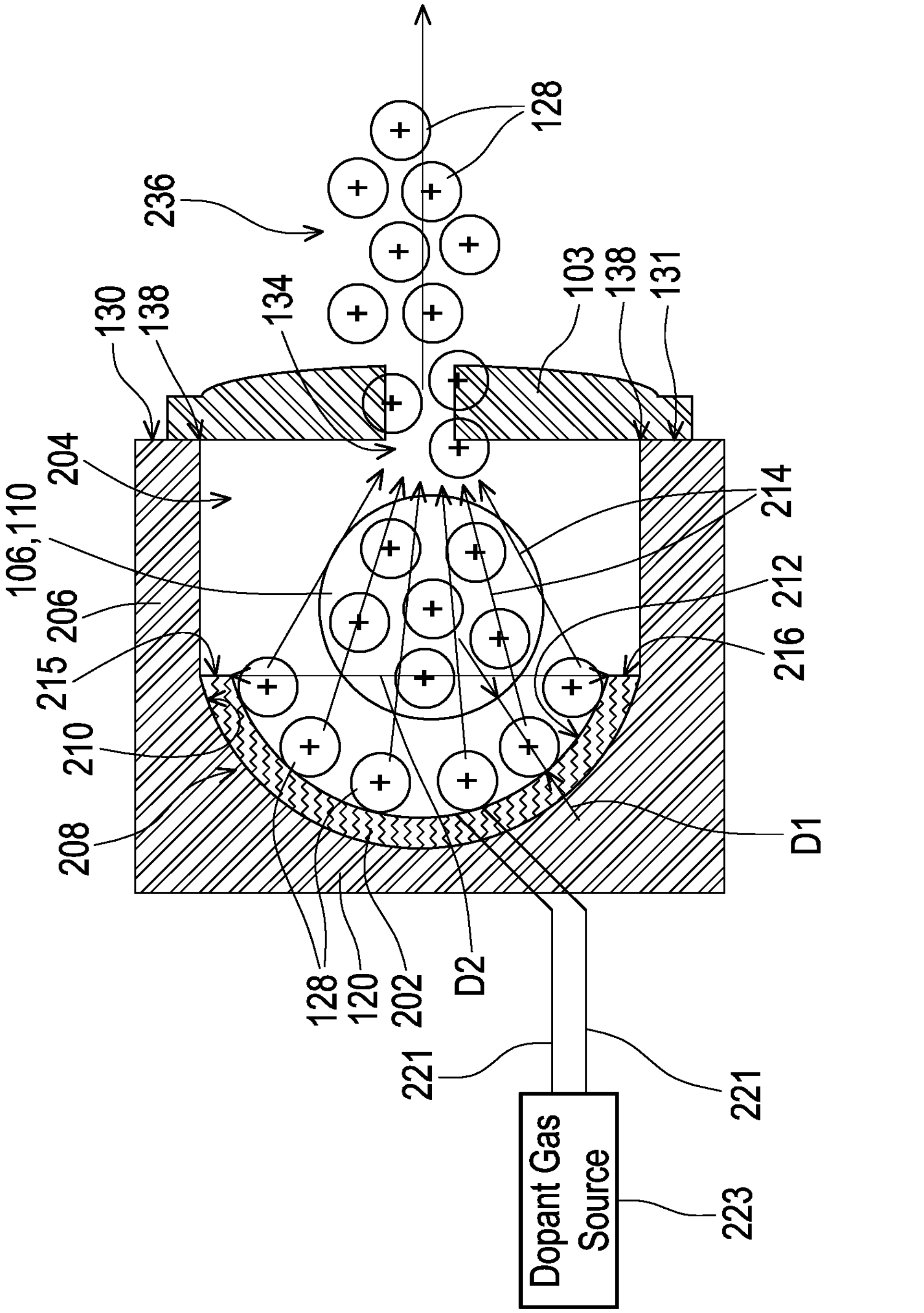
FIG. 5B is an elevational cross-section side view of the ion source head taken along line H, in accordance with some embodiments.

FIG. 5A is a top side view of an ion source head 200, in accordance with some embodiments. FIG. 5B is an elevational cross-section side view of the ion source head 200 take along a line H as shown in FIG. 5A, in accordance with some embodiments. The ion source head 200 has several of the same or similar features as the ion source head 100, and, therefore, the same or similar features will be provided with the same reference numerals between the ion source head 200 as shown in FIGS. 5A and 5B and the ion source head 100 as shown in FIGS. 2A-2C.

The ion source head 200 (see FIGS. 5A and 5B of the present disclosure) and a curved liner 202 (see FIGS. 6A-6C of the present disclosure) within the ion source head 200 reduce or prevent the ion species 128 from becoming trapped within an ion source cavity 204 of the ion source head 200, unlike the ion species 128 that become trapped in the corners 138 of the ion cavity 104 of the ion source head 100 as discussed above with respect to FIGS. 1A-1C. Preventing or reducing the ion species 128 from becoming trapped within the ion source cavity 204 delimited by an ion source container 206 of the ion source head 200 improves efficiency of the ion source head 200 in generating an ion beam 236 (see FIG. 5B of the present disclosure) relative to generating the ion beam 136 with the ion source head 100. For example, the ion source head 200 conserves energy utilized to generate the ion beam 236 relative to generating the ion beam 136 with the ion source head 100. Utilizing the ion source head 200 instead of the ion source head 100 to refine or process the solid target (e.g., semiconductor wafer, semiconductor workpiece, etc.) may decrease a period of time for refining or processing the solid target increasing units per hour (UPH) that may be manufactured and output by a semiconductor manufacturing plant (FAB) when the ion source head 200 is utilized instead of the ion source head 100.

The ion source cavity 204 of the ion source head 200, which reduces or prevents issues as set forth above with respect to the ion source head 100 as discussed in view of FIGS. 1A-1C, may also have a reduced overall volume relative to the ion cavity 104 of the ion source head 100. This reduction in volume of the ion source cavity 204 of the ion source head 200 reduces an overall footprint of the ion source head 200 relative to the ion source head 100. Reducing the footprint of the ion source head 200 relative to the ion source head 100 may reduce the footprint of a semiconductor-manufacturing tool such that a greater number of semiconductor-manufacturing tools may be provided within the FAB increasing the UPH of the FAB.

The ion source container 206 is similar to the ion source container 102 in that the ion source container 206 includes the plate 103, and, similar to the portion 105 of the ion source head 100, the ion source head 200 includes a portion 205 that is similar to the portion 105 of the ion source container 102. The portion 205 of the ion source container 206 is similar to the portion 105 of the ion source container 102 in that the portion 205 of the ion source container includes the first sidewall 120, the first end 108, and the second end 112 that is opposite to the first end. However, unlike the ion source container 102, the ion source container 206 includes a curved structure 208 at the first sidewall 120 of the portion 205 of the ion source container 206 that is structured to receive the curved liner 202. The curved structure 208 may include a curved surface 210 that abuts or is directly adjacent to the curved liner 202. In some embodiments, the curved liner 202 may be mounted to or coupled to the curved surface 210 of the curved structure 208.

The curved liner 202 includes a curved liner surface 212 at least shown in FIG. 5B unlike the flat liner surface 140 of the flat liner 132 at least shown in FIGS. 2A, 2B, 3A, and 3B of the present disclosure. The curved liner surface 212 faces away from the first sidewall 120 and faces towards the plate 103 at the second sidewall 122 of the ion source container 206. The curved liner 202 includes a first end 215 and a second end 216 that are opposite to each other and are at opposite ends of the curved liner surface 212 of the curved liner 202. The curved liner surface 212 of the curved liner is spaced apart from a respective exterior surface of the anti-cathode 106 and/or the cathode 110 by a first dimension D1, and the curved liner surface 212 of the curved liner 202 includes a second dimension D2 that extends from the first end 215 and the second end 216. In some embodiments, the second dimension D2 may be greater than or equal to 0.5-millimeters (mm), and the first dimension D1 is greater than the second dimension D2.

The ion species 128 generated in the ion source cavity 204 of the ion source head 200 are generated in the same or similar fashion as the ion species 128 generated in the ion cavity 104 of the ion source head 100. For example, the anti-cathode 106 and the cathode 110 in the ion source cavity 204 of the ion source head 200 may be utilized to generate the ion species 128 within the ion source cavity 204 in the same or similar fashion as the anti-cathode 106 and the cathode 110 in the ion cavity 104 of the ion source head 100 are utilized to generate the ion species 128 within the ion cavity 104. Accordingly, for simplicity and brevity sake of the present disclosure, the details of generating the ion species 128 within the ion source cavity 204 of the ion source head 200 is not described in detail in view of the detailed discussion of the generation of the ion species 128 in the ion cavity 104 earlier within the present disclosure.

The ion beam 236 may be generated with the ion source head 200 in a similar fashion as discussed earlier herein with respect to generating the ion beam 136 with the ion source head 100. Accordingly, for simplicity and brevity sake of the present disclosure, differences between generating the ion beam 236 with the ion source head 200 relative to generating the ion beam 136 with the ion source head 100 will be the focus of the discussion as follows herein within the present disclosure.

Unlike generating the ion beam 136 with the ion source head 100 as shown in FIGS. 1A-1C and the flat liner 132 as shown in FIGS. 2A, 2B, 3A, and 3B in which the ion species 128 are repelled, directed, or deflected away from the flat liner surface 140 of the flat liner 132, the ion beam 236 is generated by repelling, directing, or deflecting the ion species 128 generated within the ion source cavity 204 away from the curved liner surface 212 of the curved liner 202 in the ion source cavity 204 within the ion source container 206. As shown in FIG. 5B, the ion species 128 are repelled, directed, or deflected away from the curved liner surface 212 of the curved liner 202 in directions as represented by arrows 214. As shown in FIG. 5B, the arrows 214 are pointed directly towards the ion beam opening 134 that extends through the plate 103. The ion beam 236 is generated by extracting the ion species 128 through the ion beam opening 134 resulting in the ion species 128 exiting the ion beam opening 134 and generating the ion beam 236. Unlike the flat liner surface 140 of the flat liner 132 that may repel, direct, or deflect the ion species 128 into one of the corners 138 of the ion cavity 104 resulting in the ion species 128 becoming trapped (see FIG. 1C of the present disclosure) in one of the corners 138, the curved liner surface 212 of the curved liner 202 repels, directs, or deflects the ion species 128 directly towards the ion beam opening 134 as represented by the arrows 214. In other words, the ion species 128 are repelled, directed, or deflected directly towards the ion beam opening 134 such that a greater number of the ion species 128 may be extracted from the ion source cavity 204 by exiting through the ion beam opening 134 to generate the ion beam 236. As shown in FIG. 5B, the number of ion species 128 exiting the ion beam opening 134 to generate the ion beam 236 is greater than the number of ion species 128 exiting the ion beam opening 134 to generate the ion beam 136.

In view of the above discussion, by providing the curved liner 202 with the curved liner surface 212 in the ion source head 200, the ion species 128 generated in the ion source cavity 204 are more closely and accurately directed towards the ion beam opening 134 in generating the ion beam 236 relative to when the flat liner 132 with the flat liner surface 140 is utilized to generate the ion beam 136. Utilizing the curved liner 202 instead of the flat liner 132, results in the ion source head 200 being more efficient in generating the ion beam 236 relative to the ion source head 100 generating the ion beam 136. This increase in efficiency when utilizing the ion source head 200 with the curved liner 202 to generate the ion beam 236 relative to generating the ion beam 136 with the ion source head 100 with the flat liner 132 results in the ion beam 236 being stronger than the ion beam 136. This increase in efficiency in generating the ion beam 236 and increase in strength of the ion beam 236 relative to the generation and strength of the ion beam 136 allows for a processing speed of the solid target (e.g., semiconductor wafer, semiconductor workpiece, etc.) to be increased improving the UPH of the FAB. The strengths of the respective ion beams 136, 236 may be referred to as ion beam intensity. The ion beam intensity of the ion beam 236 generated utilizing the ion source head 200 with the curved liner 202 may be about 5-10% greater than the ion beam intensity of the ion beam 136 generated utilizing the ion source head 100 with the flat liner 132.

The ion source head 200 may be swapped out for the ion source head 100 in the ion source structure 144. In other words, the ion source head 200 may be swapped out such that the ion source head 100 is present where the ion source head 100 is present as shown in FIG. 4. For example, the ion source head 200 may be coupled to the coupling structure **146*b* instead of the ion source head 100**.

Utilizing the curved liner 202 in the ion source head 200 instead of the flat liner 132 in the ion source head 100 allows for a volume of the ion source cavity 204 to be smaller than a volume of the ion source cavity 104. For example, the volume of the ion source cavity 204 may be about 10-20% less than that of the volume of the ion source cavity 104. This reduction in volume of the ion source cavity 204 relative to the ion cavity 104 allows for the ion source head 200 to have a smaller footprint relative to that of the ion source head 100. The smaller footprint of the ion source head 200 relative to the ion source head 100 may allow for a semiconductor manufacturing tool to be decreased in size resulting in a greater number of semiconductor manufacturing tools that may be present within the FAB. This increase of semiconductor manufacturing tools within the FAB may increase the UPH of the FAB.

The volume of the ion source cavity 204 being less than the ion source cavity 104 may further increase efficiency of the ion source head 200 in generating the ion source beam 236 relative to the efficiency of the ion source head 100 in generating the ion beam 136. For example, the lesser volume of the ion source cavity 204 of the ion source head 200 may increase collisions between the electrons 116 and the dopant gas G within the ion source cavity 204 increasing a number of ion species 128 generated utilizing the ion source head 200 relative to a number of ion source species 128 generated utilizing the ion source head 100. This increase in the number of collisions and increase in the number of ion species 128 generated by this increase in collisions utilizing the ion source head 200 may increase the efficiency of the ion source head 200 relative to the ion source head 100 and may increase the ion beam intensity of the ion beam 236 generated by the ion source head 200 relative to the ion beam intensity of the ion beam 136 generated by the ion source head 100. In other words, the curved liner 202 may increase the efficiency of the ion source head 200 relative to the ion source head 100 and may increase the ion beam intensity of the ion beam 236 relative to the ion beam intensity of the ion beam 136.

As shown in FIG. 5B, the curved liner 202 defines a half-cylindrical portion of the ion source cavity 204 of the ion source head 200. The half-cylindrical portion of the ion source cavity 204 defined by the curved liner 202 may be adjacent to a rectangular portion of the ion source cavity 204 that is to the right of the half-cylindrical portion of the ion source cavity defined by the curved liner 202 based on the orientation of the ion source container 206 as illustrated in FIG. 5B. In other words, the half-cylindrical portion of the ion source cavity 204 is directly adjacent to the rectangular portion of the ion source cavity 204 such that the half-cylindrical portion and the rectangular portion define the volume of the ion source cavity 204 within the ion source container 206.

Figure 6C:
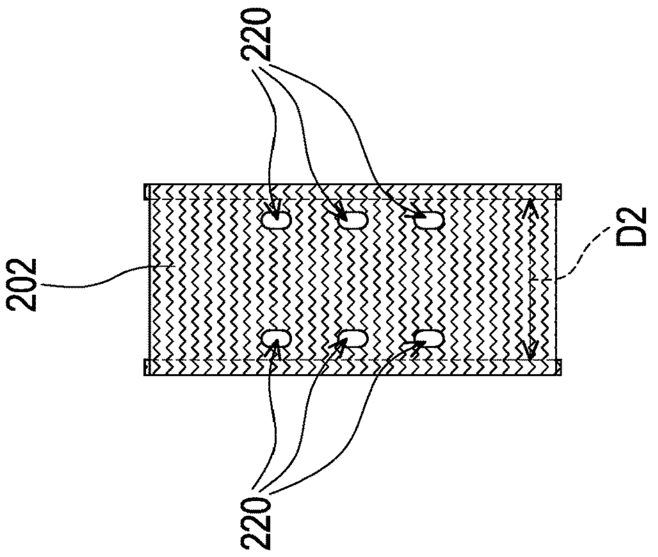
FIG. 6C is a top side view of the curved ion source deflector as shown in FIGS. 6A and 6B, in accordance with some embodiments.
Figure 6B:
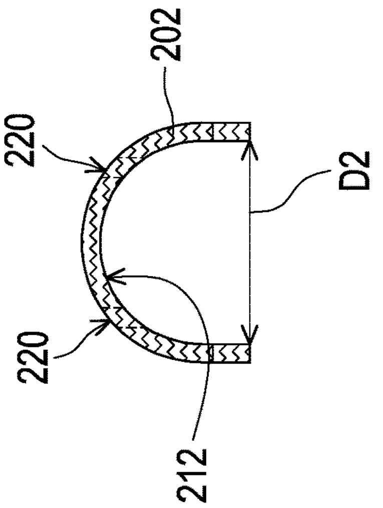
FIG. 6B is a side view of the curved ion source deflector as shown in FIG. 6A, in accordance with some embodiments.
Figure 6A:
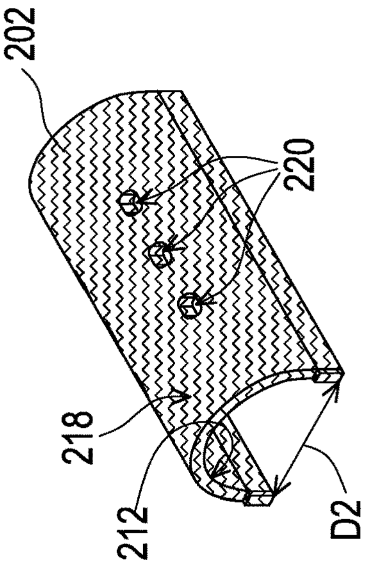
FIG. 6A is a perspective view of a curved ion source deflector in accordance with some embodiments.

FIG. 6A is a perspective view of the curved liner 202. FIG. 6B is a side view of the curved liner 202. FIG. 6C is a top side view of the curved liner 202. As shown in FIGS. 6A-6C, an opposite curved surface 218 of the curved liner 202 is opposite to the curved liner surface 212. A plurality of dopant gas hose openings 220 extend through the curved liner 202 from the opposite curved surface 218 to the curved liner surface 212. The plurality of dopant gas hose openings 220 may be configured to receive the plurality of dopant gas hoses 221 in the same or similar fashion as the plurality of dopant gas hose indentations 142 receive the plurality of dopant gas hoses 221. Accordingly, for the sake and simplicity of the present disclosure, the details of the plurality of dopant gas hose openings 220 receiving the plurality of dopant gas hoses 221 will not be reproduced herein.

However, unlike the plurality of dopant gas hose indentations 142 that are along edges of the flat liner 132, the plurality of dopant gas hose openings 220 are spaced inward from the first end 215 and the second end 216 of the curved liner 202 such that the plurality of dopant gas hose openings 220 are through holes that extend through the curved liner 202. In other words, in at least the embodiment as shown in FIGS. 6A-6C, the plurality of dopant gas hose openings 220 are spaced apart from edges of the curved liner as compared to the plurality of dopant gas hose indentations 142 that are at and along edges of the flat liner 132. The positioning of the plurality of dopant gas hose openings 220 being spaced inwardly from the first end 215 and the second end 216 of the curved liner 202 may assist in reducing the overall footprint of the ion source head 200 by assisting in reducing the volume of the ion source cavity 204 of the ion source head 200 relative to the ion source cavity 104 of the ion source head 100.

While not shown, one or more dopant gas hose through holes (not shown) may extend through the ion source container 206 such that the plurality of dopant gas hoses 221 may pass through the one or more dopant gas hose through holes to the plurality of dopant gas hose openings 220 of the curved liner 202 such that the dopant gas G may be introduced into the ion source cavity 204. Alternatively, the one or more dopant hose through holes (not shown) may extend through the ion source container 206 to the ion source cavity 204 such that the plurality of dopant gas hoses 221 may introduce the dopant gas G into the ion source cavity 204.

Figure 7:
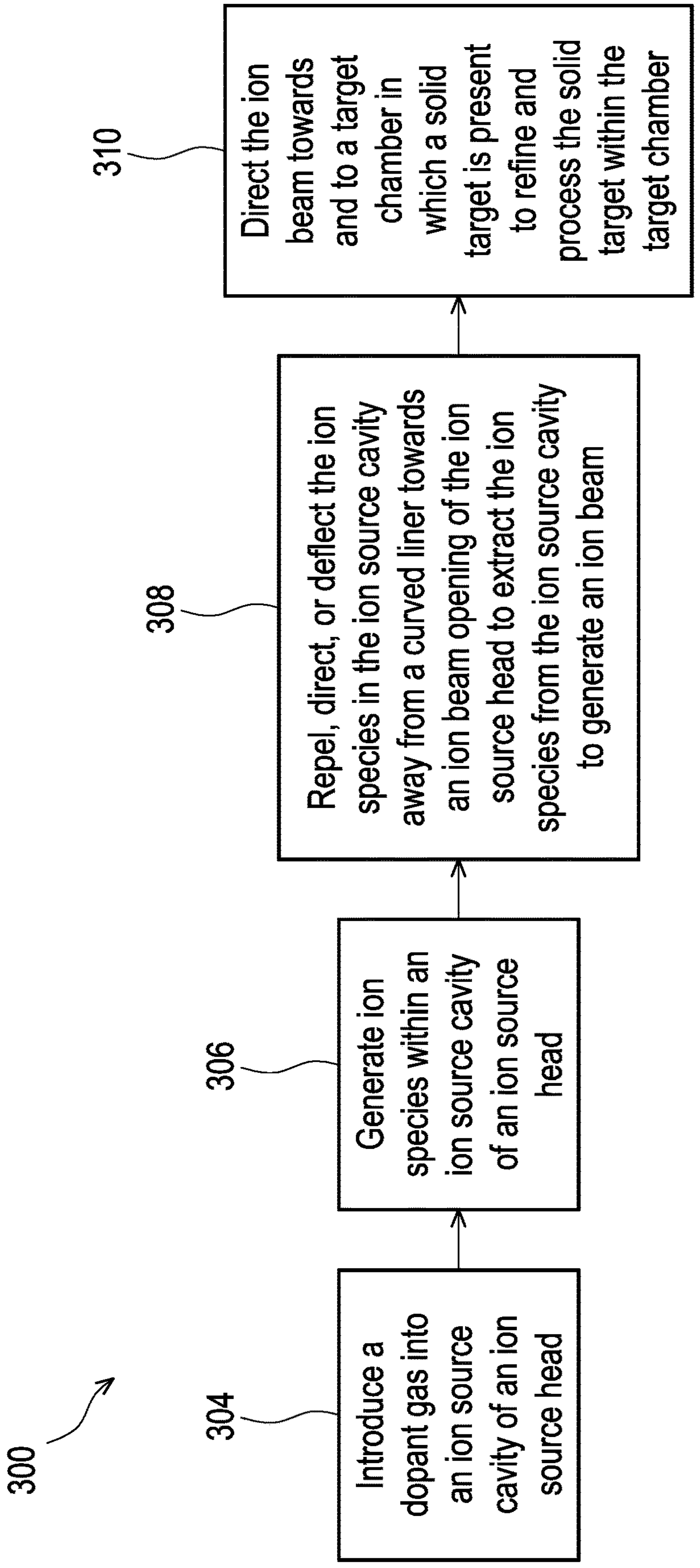
FIG. 7 is a flowchart of a method of emitting ions, in accordance with some embodiments.

FIG. 7 is a flowchart 300 of a method of refining and processing a solid target 302 (see FIG. 8A of the present disclosure), which may be, for example, a semiconductor wafer, a semiconductor workpiece, or some other suitable solid target that may be refined or processing utilizing the method in the flowchart 300. The method of refining and processing the solid target 302 in the flowchart 300 may be utilizing a metal surface finishing or patterning process, a doping process, or some other process that may adjust or change the physical, chemical, or electrical properties of the solid target. The method of refining and processing the solid target 302 in the flowchart 300 may be utilized in an overarching manufacturing process of semiconductor devices (e.g., semiconductor die, semiconductor packages, etc.) within the FAB.

In a first step 304, the dopant gas G is introduced into the ion source cavity 204 through respective outlets of the plurality of dopant gas hoses 221 at corresponding dopant gas hose openings 220 of the plurality of dopant gas hose openings 220. For example, the dopant gas G from the dopant gas source 223 (see FIG. 5B of the present disclosure) passes through the plurality of dopant gas hoses 221 and the dopant gas G then exits the outlets of the plurality of dopant gas hoses 221 into the ion source cavity.

Once enough of the dopant gas G has been introduced into the ion source cavity 204 in the first step 304, a second step 306 is carried out in which either one of or both of the anti-cathode 106 and the cathode 110 are activated to generate the electrons 116 within the ion source cavity 204. As the electrons 116 travel through the ion source cavity 204, the electrons may collide with the dopant gas G such that the ion species 128 are generated from these collisions between the dopant gas G and the electrons 116. During the second step 306, either one of or both of the anti-cathode 106 and the cathode 110 may be reversed in polarity multiple times to change directions in which the electrons 116 travel through the ion source cavity 204 to further increase a number of collisions between the electrons 116 and the dopant gas G that results in the generation of ion species. Increasing the number of collisions increases the number of ion species generated. Further details of this generation of the ion species 128 in the ion source cavity 204 are similar to those details as discussed above with the generation of the ion species 128 utilizing the ion source head 100.

After the second step 306 in which the ion species 128 have been generated, a third step 308 is carried out in which the curved liner 202 is utilized to repel, direct, or deflect the ion species 128 away from the curved liner surface 212 towards the ion beam opening 134 in the plate 103 attached to the portion 205 of the ion source container 206. For example, the ion species 128 may deflect off the curved liner surface 212 of the curved liner 202 towards the ion beam opening 134, the ion species 128 may be polarized to repel the ion species 128 towards the ion beam opening 134, or the ion species 128 may be directed by the curved liner surface 212 of the curved liner 202 in some other known fashion within the semiconductor industry to direct the ion species 128 within the ion source cavity 204 towards the ion beam opening 128. The ion species 128 being repelled, deflected, or directed towards the ion beam opening 134 in the plate 103 is represented by the arrows 218 as shown in FIG. 5B of the present disclosure. Unlike when utilizing the flat liner 132 in which the trajectory of the ion species 128 are in straight lines that may be relatively parallel with the line H (see FIG. 5A of the present disclosure) and orthogonal to the flat surface 140 of the flat liner 132 as shown in FIGS. 1A-1C, the trajectory of the arrows 218 are generally angled relative to the line H as shown in FIGS. 5A and 5B.

After the third step 308 in which the ion beam 236 is generated by the ion species 128 exiting the ion source cavity 204 through the ion beam opening 134, in a fourth step 310 the ion beam 236 is directed through various components of a system 400 (see FIGS. 8A and 8B of the present disclosure) to direct the ion beam to the solid target 302 to process and refine the solid target 302. Further details of directing the ion beam 236 will be discussed in greater detail with respect to FIGS. 8A and 8B as follows herein.

In view of the above discussion with respect to the method in the flowchart 300, as the ion species 128 are more closely and accurately directed towards the ion beam opening 134 when utilizing the curved liner 202 instead of the flat liner 132, the ion source head 200 is more efficient than the ion source head 100. As the ion source head 200 is more efficient than the ion source head 100, the ion beam 236 may have a greater beam intensity than the ion beam 136.

Figure 8A:
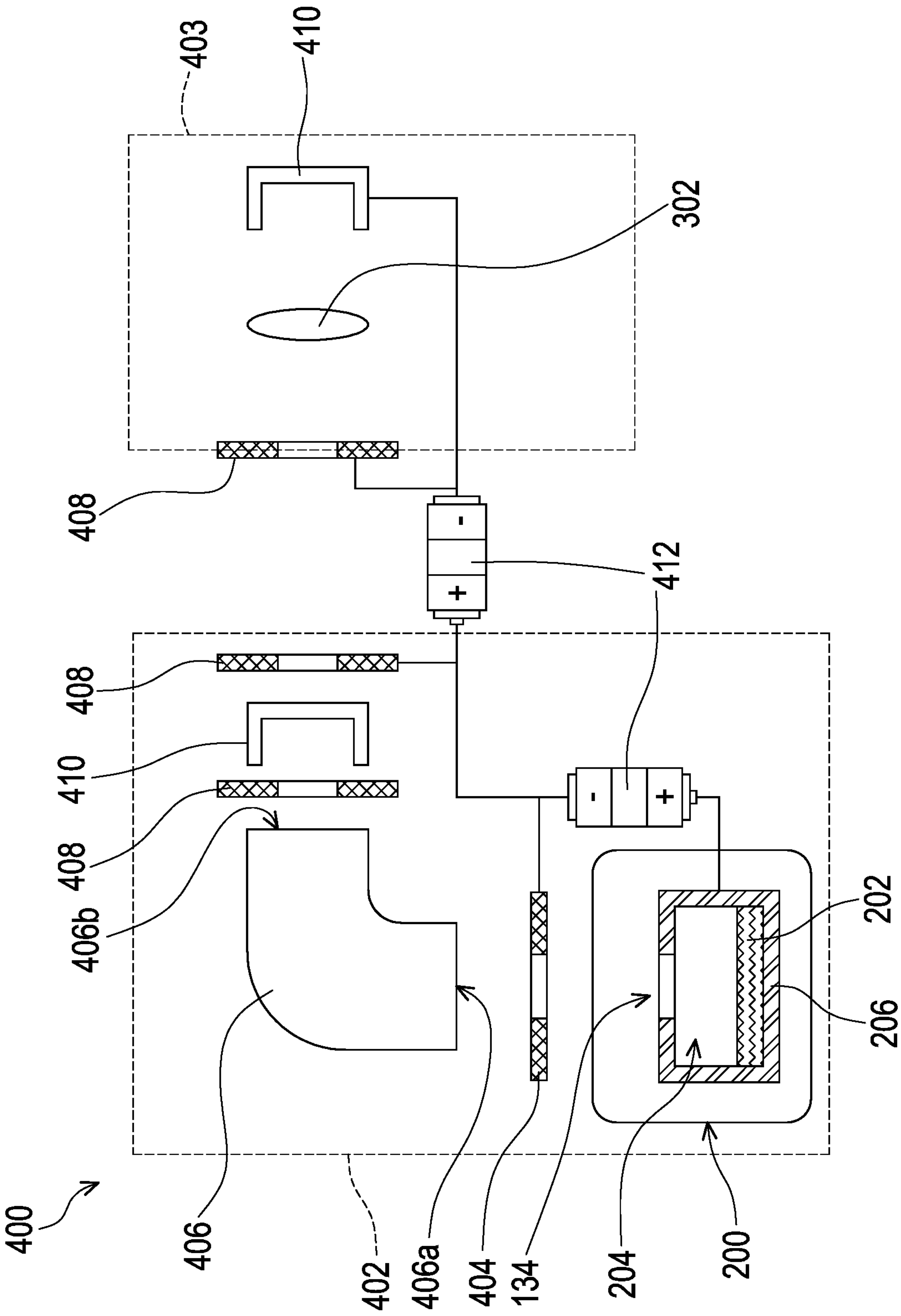
FIG. 8A is a top side view of a system that may be utilized to carry out the method in the flowchart as shown in FIG. 7, in accordance with some embodiments.
Figure 8B:
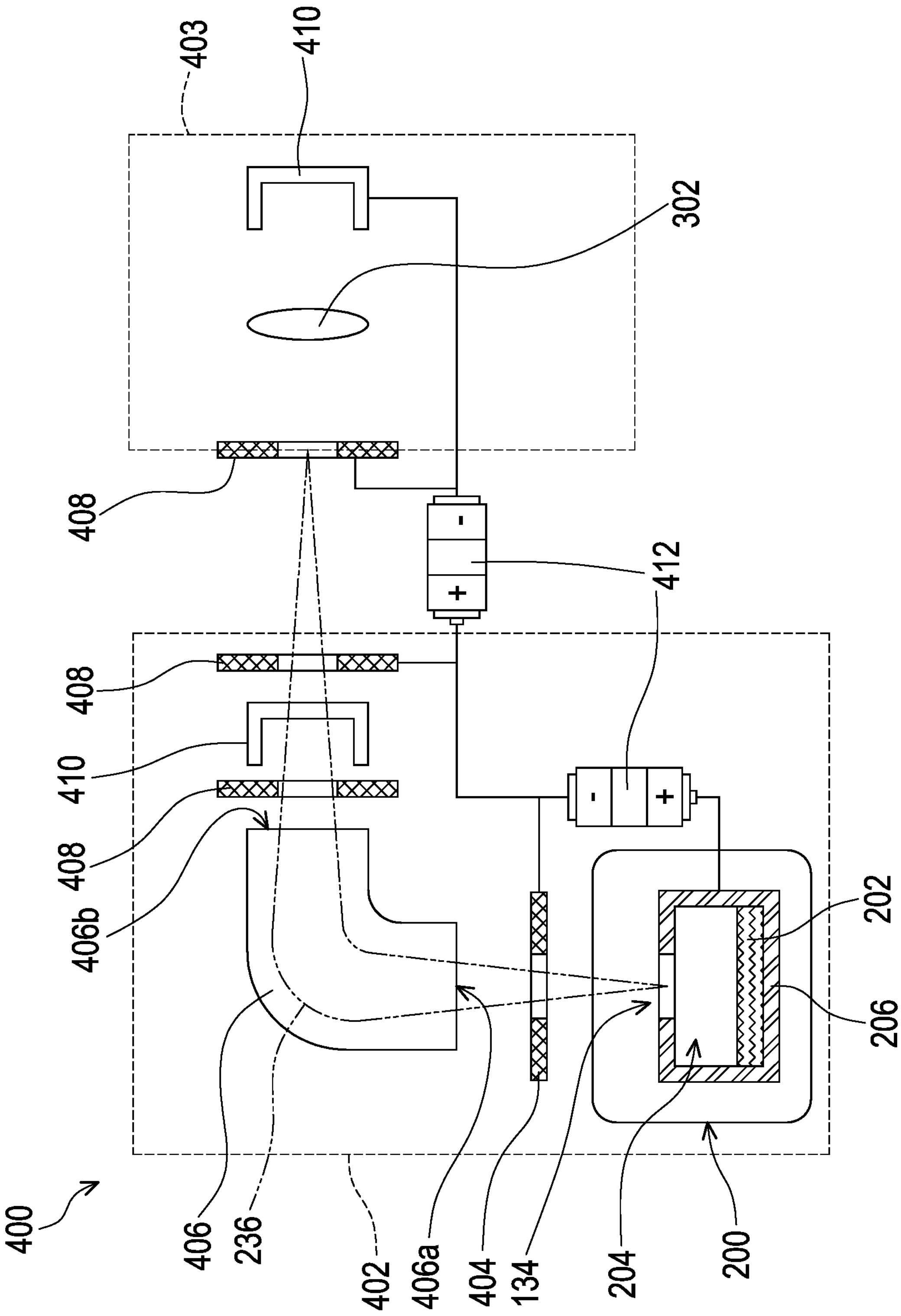
FIG. 8B is a top side view of the system as shown in FIG. 8A that may be utilized to carry out the method in the flowchart as shown in FIG. 7, in accordance with some embodiments.

FIG. 8A is a top side view of the system 400, in accordance with some embodiments, for refining and processing the solid target 302 utilizing the ion beam 236 generated utilizing the ion source head 200 in which the curved liner 202 is present. FIG. 8B is a top side view of the system 400 in which the ion beam 236 is illustrated passing through respective components of the system 400.

As shown in FIG. 8A, the system 400 includes an implanter tool 402 and a target chamber 403 that is downstream from the implanter tool 402. The implanter tool includes the source head 200 with the curved liner 202 present within the ion source cavity 204 of the ion source head 200. The implanter tool 402 further includes an extraction structure, device, or module 404 that is configured to assist in extracting the ion species 128 from the ion source cavity 204 in the ion source head 200 through the ion beam opening 134. For example, the extraction module 404 may be polarized to attract or direct the ion species 128 that were generated by the ion source head 200 and are present within the ion source cavity 204 to exit the ion source cavity 204 through the ion beam opening 134.

After the extraction module 404 extracts the ion species 128 from the ion source cavity 204 through the ion beam opening 134 to generate the ion beam 236, the ion beam 236 passes through the extraction module 404 and enters into analyzer magnet unit (AMU) 406. The ion beam 236 enters an inlet end 406*a* of the AMU 406 and the ion beam 236 exits an outlet end 406*b* of the AMU 406. As the ion beam 236 passes and travels through the AMU 406 from the inlet end 406*a* to the outlet end 406*b*, the AMU filters out and rejects ones of the ion species 128 in the ion beam 236. The ion species 128 that are filtered out or are rejected by the AMU 406 are those that are of inappropriate charge-to-mass ratio such that the ion species are inappropriate to be utilized in refining or processing the solid target 302 within the target chamber 403. In some embodiments, an acceleration/deceleration module may be present between the ion source head 200 and the AMU 406.

Once the ion beam 236 exits the AMU 406 through the outlet end 406*b* of the AMU 406, the ion beam 236 is directed towards the target chamber 403 in which the solid target 302 is present. A plurality of ion beam processing components 408 may be present between the outlet end 406*b* of the AMU and the solid target 302 within the target chamber 403. The plurality of ion beam processing components 408 may include one or more ion beam filtering modules to filter contaminant particles from the ion beam 236, one or more ion beam acceleration/deceleration ion beam modules to accelerate or decelerate the ion beam 236, one or more ion beam guide modules to direct the ion beam 236 towards the solid target 302, or some other suitable type of module to further refine and process the ion beam 236 before the ion beam 236 reaches the solid target 302 such that the solid target may be processed or refined by the ion beam 236. In some embodiments, ones of the plurality of ion beam processing components 408 may be present between the ion source head 200 and the inlet end 406*a* of the AMU. For example, one or more respective ion beam processing components may be present between the ion source head and the extraction module 404 or one or more respective ion beam processing components may be present between the extraction module 404 and the inlet end 406*a* of the AMU 406.

A plurality of ion beam sensors 410 may be present along a pathway of the ion beam 236 to monitor various characteristics and properties of the ion beam 236. For example, the plurality of ion beam sensors 410 may monitor a composition of the ion species 128 present within the ion beam 236, may monitor the beam intensity of the ion beam, may monitor the speed of the ion beam, or may monitor some other various characteristic and properties of the ion beam 236 to maintain real time information and control of the ion beam 236 when refining or processing the solid target 302 with the ion beam 236 generated by the implanter tool 402.

One or more power supplies 412 may be provided to provide power to the various respective components of the implanter tool 402 and the target chamber 403. For example, the one or more power supplies 412 may provide power to ion source head (e.g., the anti-cathode 106 and the cathode 110), the extraction module 404, the plurality of ion beam processing components 408, the plurality of ion beam sensors 410, or other respective powered components within the implanter tool 402 or the target chamber 403, respectively.

Once the ion beam 236 enters the target chamber 403, the ion species 128 of the ion beam 236 collide with the solid target 302 within the target chamber. As the ion species 128 of the ion beam 236 collide with the solid target 302, the physical, chemical, or electrical properties of the solid target 302 are adjusted or changed such that the solid target 302 is refined and processed for manufacturing various semiconductor products (e.g., semiconductor devices, semiconductor integrated circuits, semiconductor die, semiconductor chips, semiconductor packages, etc.).

Figure 9B:
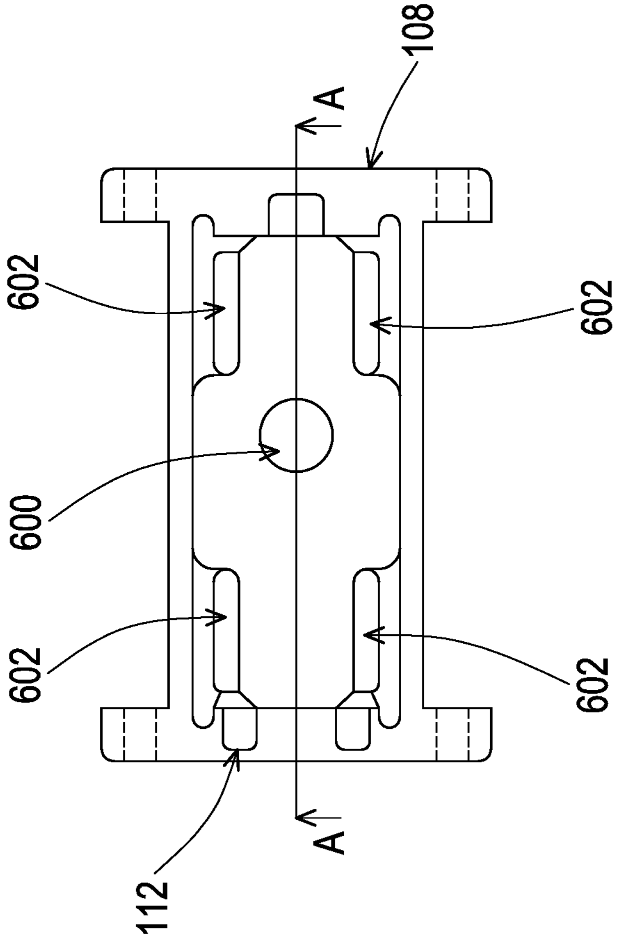
FIG. 9B is a front side view of the alternative of the portion of the ion source head as shown in FIG. 9A, in accordance with some embodiments.
Figure 9A:
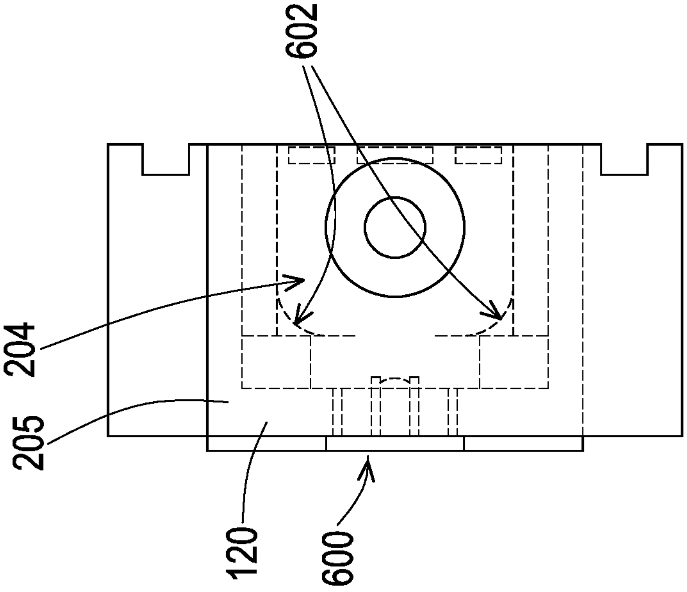
FIG. 9A is a side view of an alternative of a portion of the ion source head as shown in FIGS. 5A and 5B, in accordance with some embodiments.
Figure 9C:
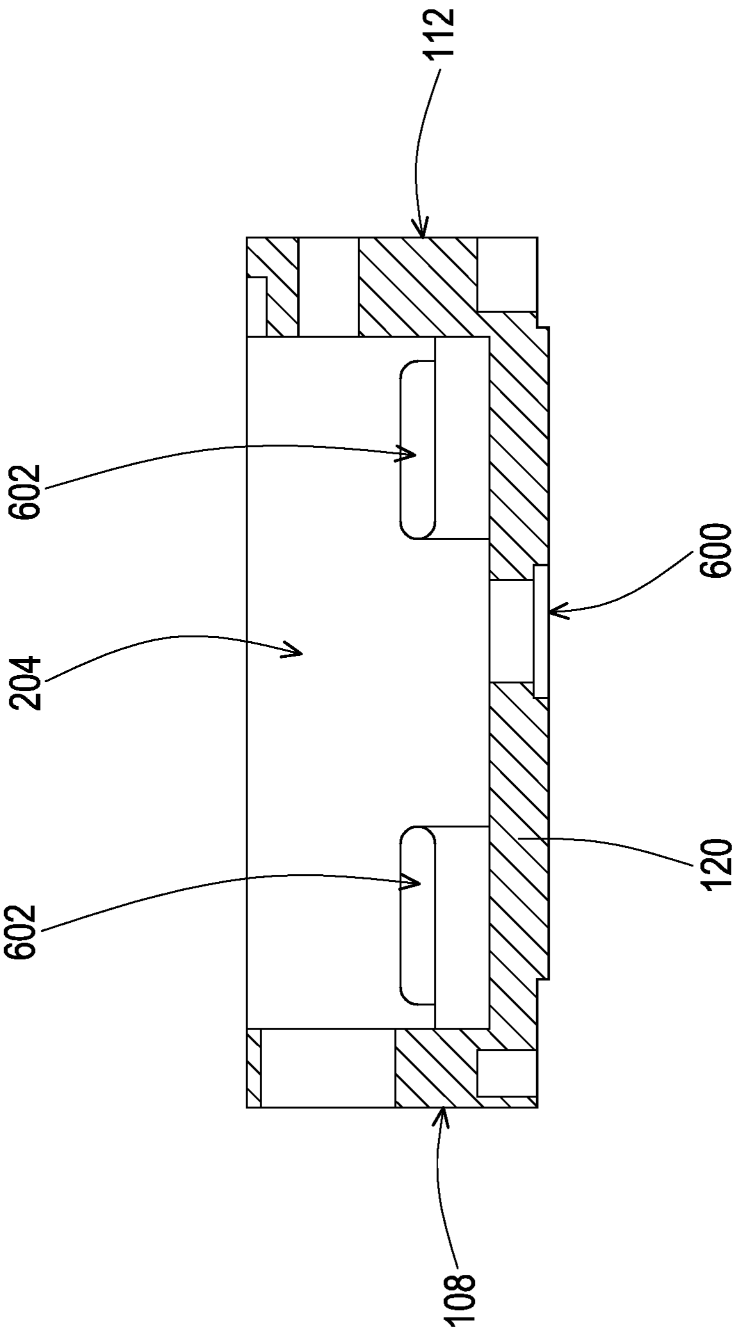
FIG. 9C is a cross-sectional view taken along line A-A as shown in FIG. 9B of the alternative of the portion of the ion source head as shown in FIGS. 9A and 9B, in accordance with some embodiments.

FIG. 9A is side view of an alternative of the portion 205 of the ion source container 206 of the ion source head 200. FIG. 9B is a front side view of the alternative of the portion 205 of the ion source container 206 of the ion source head as shown in FIG. 9A. FIG. 9C is a cross-sectional view of the alternative of the portion 205 of the ion source container 206 of the ion source head 200 taken along line A-A as shown in FIG. 9B. The same or similar reference numerals have been utilized for the same or similar features in the alternative of the portion 205 of the ion source head 200 relative to the features of the portion 205 of the ion source head 200 as shown in FIGS. 5A and 5B of the present disclosure.

The alternative of the portion 205 of the ion source container 206 includes a dopant gas hose through hole 600 that extends through the alternative of the portion 205 of the ion source container 206 such that one or more dopant gas hoses, which may be the same or similar to the plurality of dopant gas hoses 121, 221, respectively, may pass through the dopant gas hose through hole 600 to provide the dopant gas G to the ion source cavity 204 of the alternative of the portion 205 of the ion source container 206. However, unlike the portion 205 of the ion source container 206 that includes the curved surface 210 that abuts the curved liner 202, the alternative of the portion 205 of the ion source container 206 as shown in FIGS. 9A-9C includes a plurality of curved surfaces 602. The curved liner 202 when present within the ion source cavity 204 abuts or is directly adjacent to the plurality of curved surfaces 602. In some embodiments, the curved liner 202 may be mounted to or coupled to the plurality of curved surfaces 602. As shown in FIG. 9B, the plurality of curved surfaces 602 are at corners of the ion source cavity 204 delimited by the alternative of the portion 205 of the ion source container 206.

Figure 10:
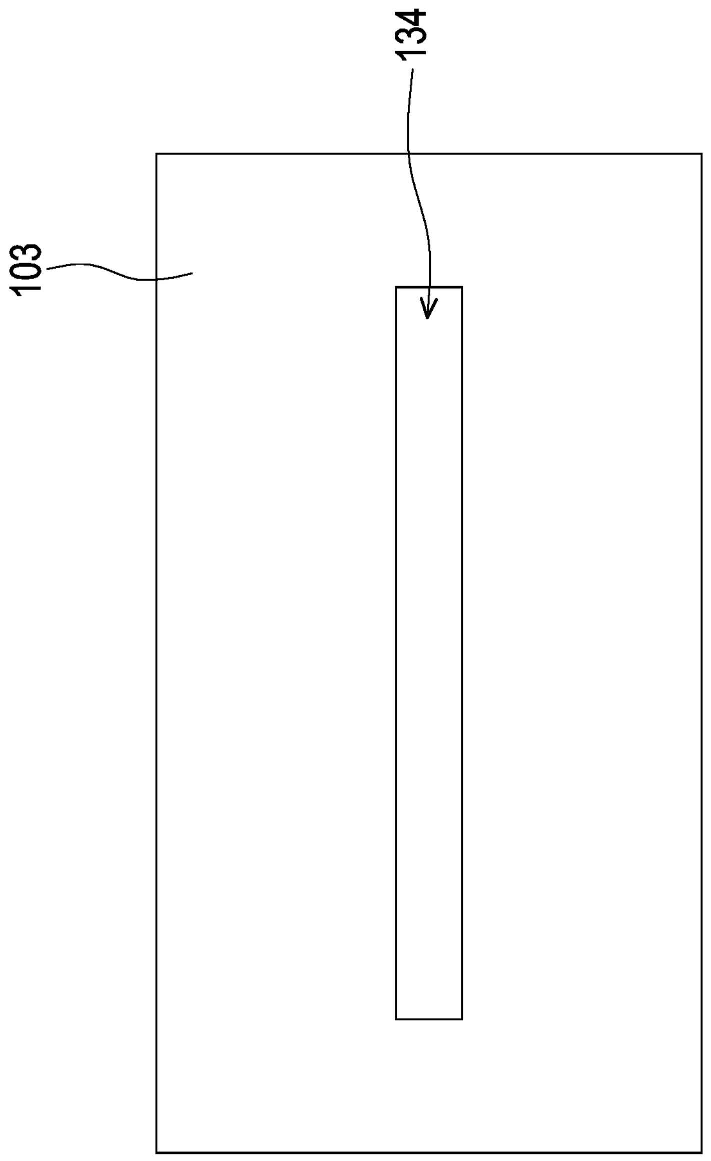
FIG. 10 is a front side view of a plate, in accordance with some embodiments.

FIG. 10 is a front side view of at least one embodiment of the plate 103. In the at least one embodiment of the plate 103 as shown in FIG. 10, the opening 134 is a slot that extends a majority of the plate 103. As discussed earlier herein, in some alternative embodiments, the opening 134 that extends through the plate 103 may extend a minority of the plate 103.

In view of the above discussion, the ion source head 200 may be more efficient than the ion source head 100 due to the presence of the curved liner 202 in the ion source head 200 instead of the flat liner 132 present within the ion source head 100. For example, the curved liner 202 more closely and accurately repels, directs, or deflects the ion species 128 towards the ion beam opening 134 such that the ion beam 236 is stronger than the ion beam 136. This reduces or prevents the ion species 128 generated within the ion source cavity 204 not becoming trapped within the ion source cavity 204 (e.g., within corners of the ion source cavity 204) unlike the ion species 128 that become trapped in the corners 138 of the ion source cavity 104 of the ion source head 100. In other words, if a power supply supplies the same amount of power to the anti-cathode 106 and the cathode 110 of the ion source head 200 and the anti-cathode 106 and the cathode 110 of the ion source head 100, the ion beam 236 will be stronger than the ion beam 136 even when the same amount of power is supplied to the ion source head 200 and the ion source head 100 when generating the ion beams 136, 236, respectively. As the ion source head 200 is more efficient in generating the ion beam 236 than the ion source head 100 is in generating the ion beam 136, the ion source head 200 may have an increase speed in processing the solid target 302 such that the UPH of the FAB may be increased when utilizing the ion source head 200 instead of the ion source head 100.

In view of the above discussion, as the volume of the ion source cavity 204 is less than the ion source cavity 104, the ion source head 200 may generate a greater number of the ion species 128 relative to the ion species 128 generated by the ion source head 100. The lesser volume of the ion source cavity 204 results in a greater number of collisions between the electrons 116 and the dopant gas G within the ion source cavity 204 relative to collisions that occur between the electrons and the dopant gas G within the ion source cavity 104. This increase in collisions resulting in the greater number of ion species 128 generated when utilizing the ion source head 200 instead of the ion source head 100 results in the ion source head 200 being more efficient than the ion source head 100 and results in the ion beam 236 being able to have a higher beam intensity than the ion beam 136.

In view of the above discussion, as the ion source head 200 is more efficient than the ion source head 100, the UPH of the FAB may be increased as utilizing the ion source head 200 over the ion source head 100 may increase a speed at which the solid target 302 may be processed and refined when exposed to the ion beam 236 instead of the ion beam 136. Increasing the UPH of the FAB may result in a greater number of final manufactured semiconductor devices (e.g., semiconductor die, semiconductor integrated circuits, semiconductor packages, etc.) being sold and shipped to customers and consumers increasing profit margins for the FAB.

At least one embodiment of an ion source head of the present disclosure may be summarized as including: an ion source container including: an ion source cavity within the ion source container; a first end; a second end opposite to the first end; and a first side transverse to the first end and the second end, the first side extending from the first end to the second end; a cathode at the first end of the ion source container; an anti-cathode at the second end of the ion source container; and a curved liner within the ion source cavity of the ion source container and between the first end and the second end of the ion source container, and the curved liner is at the first side of the ion source container.

At least one embodiment of a system of the present disclosure may be summarized as including: an implanter tool including: an ion source head including: an ion source container including: an ion source cavity; a first end that delimits the ion source cavity; a second end opposite to the first end that delimits the ion source cavity; and a first side transverse to the first end and the second end, the first side extends from the first end to the second end; a cathode at the first end of the container; an anti-cathode at the second end of the container; and a curved liner within the ion source cavity and between the first end and the second end of the ion source container, the curved liner is at the first side of the ion source container and delimits the ion source cavity; an extraction module downstream the ion source head, the extraction module is configured to extract ions species generated in the ion source cavity.

At least one embodiment of a method of the present disclosure may be summarized as including: activating a cathode and an anti-cathode to generate an ion species within an ion source cavity of an ion source head of an implanter tool, the ion source cavity is delimited by a curved liner within the ion source cavity of the ion source head of an implanter tool; and forming an ion beam by extracting the ions generated within the ion source cavity by activating an extraction module downstream from the ion source head of the implanter tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion source head, comprising:
an ion source container including:
an ion source cavity within the ion source container;
a first end;
a second end opposite to the first end; and
a first side transverse to the first end and the second end, the first side extending from the first end to the second end;
a cathode at the second end of the ion source container;
an anti-cathode at the first end of the ion source container;
a curved liner within the ion source cavity of the ion source container and between the first end and the second end of the ion source container, and the curved liner is at the first side of the ion source container; and
a plate including an ion beam opening extending through the plate, and wherein the plate is coupled to the ion source container, the plate is transverse the first end and the second end of the ion source container, and the plate is opposite to the first side of the ion source container.

2. The ion source head of claim 1, wherein the ion beam opening in the plate overlaps the curved liner.

3. The ion source head of claim 1, wherein the curved liner is spaced radially outwards from the anti-cathode by a first dimension greater than or equal to 0.5-millimeters (mm).

4. The ion source head of claim 3, wherein the curved liner further includes:
a first end;
a second end opposite to the first end;
a curved surface that extends from the first end to the second end; and
a second dimension that extends from the first end to the second end, the second dimension is greater than the first dimension.

5. The ion source head of claim 1, wherein the ion source container includes a curved structure at the first side of the ion source container, and wherein the curved structure is structured to receive the curved liner.

6. The ion source head of claim 1, wherein the curved liner includes at least one opening that extends through the curved liner.

7. The ion source head of claim 6, wherein the at least one opening is structured to receive a dopant fluid hose configured to supply a dopant fluid into the ion source cavity.

8. The ion source head of claim 1, wherein a substantially half-cylindrical portion of a volume within the ion source cavity is delimited by the curved liner.

9. The ion source head of claim 8, wherein a substantially rectangular portion of the volume within the ion source cavity is directly adjacent to the substantially half-cylindrical portion of the volume of the ion source cavity.

10. A system, comprising:
an implanter tool including:
an extraction module; and
an ion source head including:
an ion source container including:
an ion source cavity;
a first end that delimits the ion source cavity;
a second end opposite to the first end that delimits the ion source cavity; and
a first side transverse to the first end and the second end, the first side extends from the first end to the second end;
a cathode at the second end of the ion source container;
an anti-cathode at the first end of the ion source container; and
a curved liner within the ion source cavity and between the first end and the second end of the ion source container, the curved liner is at the first side of the ion source container and delimits the ion source cavity;
an analyzer magnet unit (AMU) downstream from the ion source head, and the analyzer magnet unit (AMU) includes an ion inlet end and an ion outlet end opposite to the ion inlet end, and
wherein the extraction module is downstream of the ion source head and the extraction module is configured to extract ions species generated in the ion source cavity.

11. The system of claim 10, further comprising a target chamber downstream from the ion outlet end of the analyzer magnet unit (AMU).

12. The system of claim 10, further comprising at least one sensor downstream from the ion source head, the at least one sensor is configured to monitor an intensity of an ion beam generated utilizing the ion source head.

13. The system of claim 10, wherein a substantially half-cylindrical portion of a volume within the ion source cavity is delimited by the curved liner.

14. The system of claim 13, wherein a substantially rectangular portion of the volume within the ion source cavity is directly adjacent to the substantially half-cylindrical portion of the volume of the ion source cavity.

15. A method, comprising:
activating a cathode and an anti-cathode to generate an ion species within an ion source cavity of an ion source head of an implanter tool, the ion source cavity is delimited by a curved liner within the ion source cavity of the ion source head of the implanter tool;

forming an ion beam by extracting the ion species generated within the ion source cavity by activating an extraction module downstream from the ion source head of the implanter tool; and directing the ion beam of the ions species extracted from the ion source cavity by the extraction module at a solid target within a target chamber downstream from the implanter tool.

16. The method of claim 15, wherein directing the ion beam of the ion species extracted from the ion source cavity by the extraction module at the solid target within the target chamber downstream from the implanter tool further includes changing physical, chemical, or electrical properties of the solid target within the target chamber downstream from the implanter tool.

17. The method of claim 15, further comprising measuring an intensity of the ion beam of the ion species with at least one sensor downstream from the ion source head.

18. The method of claim 15, further comprising passing the ion beam through an analyzer magnet unit (AMU) filtering out and rejecting respective ions of the ion species.

19. The ion source head of claim 1, wherein the ion beam opening is a slot having a first dimension in a first direction and a second dimension in a second direction transverse to the first direction, and the first dimension is greater than the second dimension.

20. The system of claim 10, wherein the extraction module is between the ion source head and the ion inlet end the analyzer magnet unit (AMU).

* * * * *